(12) United States Patent
Wang

(10) Patent No.: US 11,316,132 B2
(45) Date of Patent: Apr. 26, 2022

(54) DISPLAY DEVICE WITH MULTIPLE HARDENING LAYERS AND MANUFACTURING METHOD THEREOF

(71) Applicant: WUHAN CHINA STAR OPTOELECTRONICS SEMICONDUCTOR DISPLAY TECHNOLOGY CO., LTD., Hubei (CN)

(72) Inventor: Fang Wang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 114 days.

(21) Appl. No.: 16/638,761

(22) PCT Filed: Dec. 20, 2019

(86) PCT No.: PCT/CN2019/127103
§ 371 (c)(1),
(2) Date: Feb. 13, 2020

(87) PCT Pub. No.: WO2021/056876
PCT Pub. Date: Apr. 1, 2021

(65) Prior Publication Data
US 2021/0091338 A1 Mar. 25, 2021

(30) Foreign Application Priority Data
Sep. 25, 2019 (CN) .......................... 201910911614.8

(51) Int. Cl.
H01L 51/52 (2006.01)
H01L 27/32 (2006.01)
(Continued)

(52) U.S. Cl.
CPC ............ *H01L 51/5253* (2013.01); *G02B 1/18* (2015.01); *H01L 27/322* (2013.01);
(Continued)

(58) Field of Classification Search
None
See application file for complete search history.

(56) References Cited

U.S. PATENT DOCUMENTS

2008/0054796 A1* 3/2008 Sung ................... H01L 27/3276
313/504
2016/0095172 A1* 3/2016 Lee ....................... C23C 16/401
313/504
(Continued)

FOREIGN PATENT DOCUMENTS

CN 107464828 A 12/2017
CN 107507846 A 12/2017
(Continued)

*Primary Examiner* — Nduka E Ojeh
(74) *Attorney, Agent, or Firm* — Mark M. Friedman

(57) ABSTRACT

A display panel and a manufacturing method thereof are provided. The display panel includes a substrate, a thin film transistor (TFT) device layer, a luminescent device layer, and a thin film encapsulation layer, wherein the thin film encapsulation layer includes a first inorganic layer, a first hardening layer disposed on the first inorganic layer, a second inorganic layer disposed on the first hardening layer, an organic planarization layer disposed on the second inorganic layer, a second hardening layer disposed on the organic planarization layer, a third inorganic layer disposed on the second hardening layer, and a third hardening layer disposed on the third inorganic layer, thereby realizing a cover window and encapsulation structure characteristics at the same time, and achieving ultra-thin encapsulation.

15 Claims, 4 Drawing Sheets

(51) Int. Cl.
*G02B 1/18* (2015.01)
*H01L 51/56* (2006.01)
(52) U.S. Cl.
CPC ........ *H01L 27/323* (2013.01); *H01L 27/3244* (2013.01); *H01L 51/56* (2013.01); *H01L 2227/323* (2013.01)

(56) References Cited

U.S. PATENT DOCUMENTS

2016/0369131 A1   12/2016  Lim et al.
2017/0018737 A1*  1/2017  Kim .................... H01L 51/5268

FOREIGN PATENT DOCUMENTS

| CN | 108269827 | A | * | 7/2018 |
| CN | 108269827 | A | | 7/2018 |
| CN | 109285958 | A | | 1/2019 |

* cited by examiner

DISPLAY DEVICE WITH MULTIPLE HARDENING LAYERS AND MANUFACTURING METHOD THEREOF

FIELD OF INVENTION

The present disclosure relates to the field of display technologies, and more particularly, to a display panel and a method of manufacturing the display panel.

BACKGROUND OF INVENTION

Flexible organic light-emitting diode display technology having bendable and rollable characteristics, and can be used to make products into a variety of folded or rolled forms. Therefore, it has attracted market attention and has become mainstream of future display development.

To meet requirements of development of flexible displays and higher bending performance, and allow touch layers to no longer be separately disposed in a stack structure of a module, researchers continue to strive to make display panel structures thinner to provide the market with thinner and lighter display panels that are easy to carry and have better bending features.

However, organic light-emitting diode display panels are very sensitive to water vapor and oxygen, and aging of electrodes and quenching of excitons are all direct reasons for shortened lifespan and reduced efficiency of display devices. Therefore, designs of organic light-emitting diode display panels have become more important.

Therefore, there is a need to provide a display panel and a manufacturing method thereof to solve the problems in the prior art.

SUMMARY OF INVENTION

To solve the above problems, the present disclosure provides a display panel and manufacturing method thereof which have the cover window and the encapsulation structure characteristics at the same time, and achieve ultra-thin encapsulation.

To achieve the above object the present disclosure provides a display panel, including a substrate, a thin film transistor (TFT) device layer, a luminescent device layer, and a thin film encapsulation layer, wherein the thin film encapsulation layer includes a first inorganic layer; a first hardening layer disposed on the first inorganic layer; a second inorganic layer disposed on the first hardening layer; an organic planarization layer disposed on the second inorganic layer; a second hardening layer disposed on the organic planarization layer; a third inorganic layer disposed on the second hardening layer; and a third hardening layer disposed on the third inorganic layer.

In one embodiment of the present disclosure, further comprising a dam material layer disposed on side edges of the first inorganic layer, the first hardening layer, the second inorganic layer, the organic planarization layer, the second hardening layer, the third inorganic layer, and the third hardening layer.

In one embodiment of the present disclosure, further comprising a fourth inorganic layer disposed on the third hardening layer; and a fourth hardening layer disposed on the fourth inorganic layer.

In one embodiment of the present disclosure, the fourth hardening layer comprises a nano-anti-fingerprint layer.

In one embodiment of the present disclosure, a thickness of the second hardening layer is greater than a thickness of the first hardening layer and a thickness of the third hardening layer.

In one embodiment of the present disclosure, a material of the first inorganic layer comprises silicon nitride.

In one embodiment of the present disclosure, a material of the second inorganic layer comprises silicon oxide.

In one embodiment of the present disclosure, a material of the third inorganic layer comprises silicon nitride.

In one embodiment of the present disclosure, further comprising a touch layer and a color filter layer disposed between the third hardening layer and the second hardening layer.

In one embodiment of the present disclosure, the thin film encapsulation layer is disposed on a cathode of the luminescent device layer.

To achieve the above object, the present disclosure further provides a method of manufacturing a display panel, including forming a substrate, a TFT device layer, and a luminescent device layer; forming a thin film encapsulation layer, wherein steps of forming the thin film encapsulation layer includes forming a first inorganic layer; forming a first hardening layer on the first inorganic layer; forming a second inorganic layer on the first hardening layer; forming an organic planarization layer on the second inorganic layer; forming a second hardening layer on the organic planarization layer; forming a third inorganic layer on the second hardening layer; and forming a third hardening layer on the third inorganic layer.

In one embodiment of the present disclosure, further comprising forming a dam material layer on side edges of the first inorganic layer, the first hardening layer, the second inorganic layer, the organic planarization layer, the second hardening layer, the third inorganic layer, and the third hardening layer.

In one embodiment of the present disclosure, further comprising forming a fourth inorganic layer on the third hardening layer.

In one embodiment of the present disclosure, further comprising forming a fourth hardening layer on the fourth inorganic layer.

In one embodiment of the present disclosure, the dam material layer is further forming on side edges of the fourth inorganic layer and the fourth hardening layer.

In one embodiment of the present disclosure, the fourth hardening layer is formed by performing a coating method and an UV-cured on the fourth inorganic layer.

To achieve the above object, the present disclosure further provides a display panel, including a metal layer; a connection layer disposed on the metal layer; an organic light-emitting diode display device layer disposed on the connection layer; and a thin film encapsulation layer disposed on the organic light-emitting diode display device layer; wherein the thin film encapsulation layer includes a first inorganic layer; a first hardening layer disposed on the first inorganic layer; a second inorganic layer disposed on the first hardening layer; an organic planarization layer disposed on the second inorganic layer; a second hardening layer disposed on the organic planarization layer; a third inorganic layer disposed on the second hardening layer; and a third hardening layer disposed on the third inorganic layer.

In one embodiment of the present disclosure, the display panel further comprises a dam material layer disposed on side edges of the first inorganic layer, the first hardening layer, the second inorganic layer, the organic planarization layer, the second hardening layer, the third inorganic layer, and the third hardening layer.

In one embodiment of the present disclosure, the display panel further comprises a fourth inorganic layer disposed on the third hardening layer; and a fourth hardening layer disposed on the fourth inorganic layer.

In one embodiment of the present disclosure, a thickness of the metal layer is thicker than three times of a thickness of the fourth hardening layer.

A display panel and a manufacturing method thereof are provided by the present disclosure. The display panel includes a substrate, a thin film transistor (TFT) device layer, a luminescent device layer, and a thin film encapsulation layer, wherein the thin film encapsulation layer includes a first inorganic layer, a first hardening layer disposed on the first inorganic layer, a second inorganic layer disposed on the first hardening layer, an organic planarization layer disposed on the second inorganic layer, a second hardening layer disposed on the organic planarization layer, a third inorganic layer disposed on the second hardening layer, and a third hardening layer disposed on the third inorganic layer, thereby achieving characteristics of a conventional stacked structure in which a cover window protects a lower layer stacked structure, further blocking off water vapor and oxygen from eroding a light-emitting device, ensuring display life, simplifying manufacturing process and reducing production cost, and achieving an effect of ultra-thin encapsulation.

In order to make the above description of the present disclosure more comprehensible, the following describes the preferred embodiments and the accompanying figures in detail as follow:

DETAILED DESCRIPTION OF PREFERRED EMBODIMENTS

Figure 1:
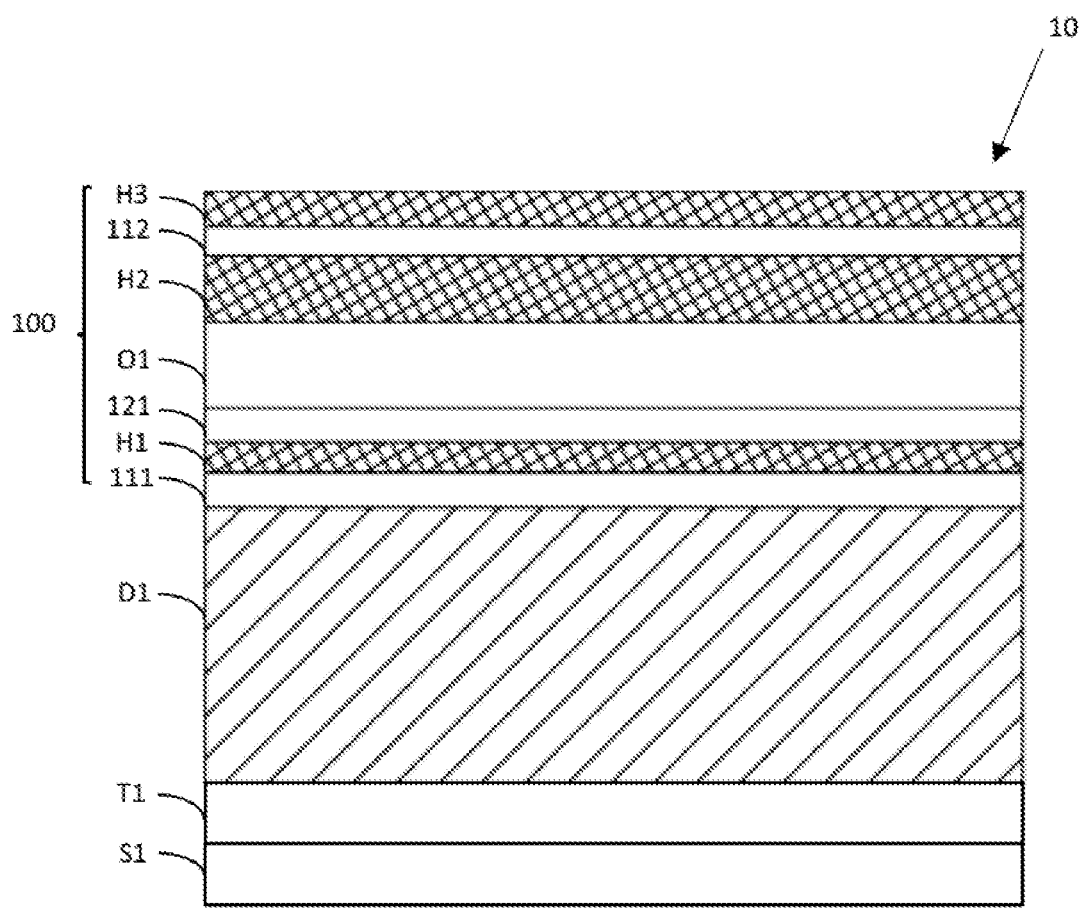
FIG. 1 shows a schematic structural diagram of a display panel according to one embodiment of the present disclosure.

The following is a description of each embodiment with reference to additional figures to illustrate specific embodiments in which the present disclosure can be implemented. The directional terms mentioned in the present disclosure, such as up, down, front, back, left, right, inside, outside, side, etc., are only directions referring to the figures. Therefore, the directional terms are to explain and understand the disclosure, not to limit it.

In the figure, similarly structured units are denoted by the same reference numerals.

Please refer to FIG. 1, FIG. 1 shows a schematic structural diagram of a display panel according to one embodiment of the present disclosure. The display panel 10 includes a substrate S1, a thin film transistor (TFT) device layer T1, a luminescent device layer D1, and a thin film encapsulation layer 100. The thin film encapsulation layer 100 includes a first inorganic layer 111 disposed on the luminescent device layer D1, a first hardening layer H1 disposed on the first inorganic layer 111, a second inorganic layer 121 disposed on the first hardening layer H1, an organic planarization layer O1 disposed on the second inorganic layer 121, a second hardening layer H2 disposed on the organic planarization layer O1, a third inorganic layer 112 disposed on the second hardening layer H2, and a third hardening layer H3 disposed on the third inorganic layer 112.

In one embodiment of the present disclosure, the first inorganic layer 111 includes silicon nitride.

In one embodiment of the present disclosure, the second inorganic layer 121 includes silicon oxide.

In one embodiment of the present disclosure, the third inorganic layer 112 includes silicon nitride.

In one embodiment of the present disclosure, the organic planarization layer O1 is formed by using organic silicon which has characteristics of good recovery performance, elasticity, and optical performance to achieve effects of planarizing an encapsulation structure and enhancing stress relief.

In one embodiment of the present disclosure, the thin film encapsulation layer 100 is disposed on a cathode of the luminescent device layer.

In one embodiment of the present disclosure, a thickness of the second hardening layer H2 is greater than a thickness of the first hardening layer H1 and a thickness of the third hardening layer H3, so that the encapsulation layer not only serves to block off water vapor and oxygen from eroding a light emitting device to ensure display life, but also has characteristics of a conventional stacked structure in which a cover window protects a lower layer stacked structure.

In one embodiment of the present disclosure, a thickness of the first hardening layer H1 is similar to a thickness of the third hardening layer H3.

In one embodiment of the present disclosure, a thickness of the first hardening layer H1 is 2 μm.

In one embodiment of the present disclosure, a thickness of the second hardening layer H2 is 5 μm.

In one embodiment of the present disclosure, a thickness of the third hardening layer H3 is 2 μm.

Figure 2:
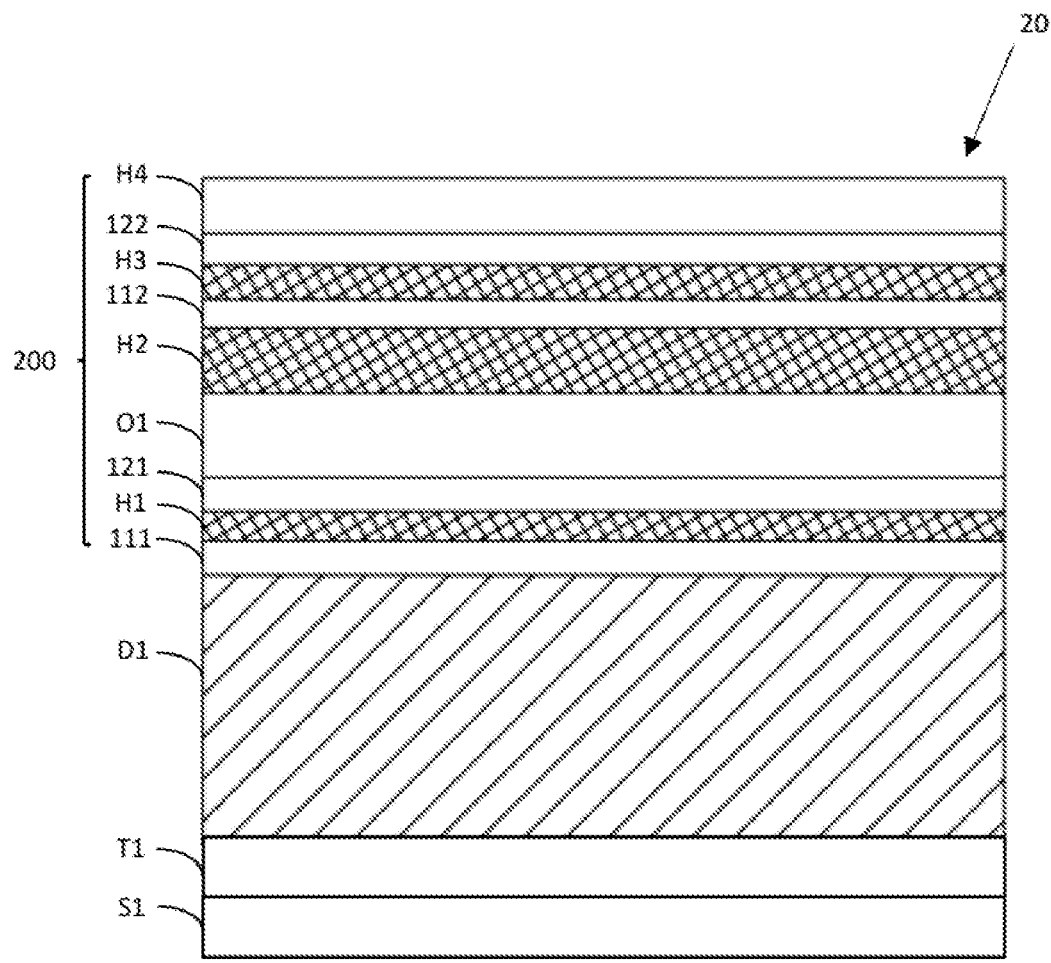
FIG. 2 shows a schematic structural diagram of a display panel according to one embodiment of the present disclosure.

Please refer to FIG. 2, FIG. 2 shows a schematic structural diagram of a display panel according to one embodiment of the present disclosure. A difference between a window film encapsulation layer 200 of the display panel 20 and the thin film encapsulation layer 100 is that the window film encapsulation layer 200 further includes a fourth inorganic layer 122 disposed on the third hardening layer H3, and a fourth hardening layer H4 disposed on the fourth inorganic layer 122, thereby further achieving an effect of enhancing strength of a window film encapsulation structure.

In one embodiment of the present disclosure, a thickness of the fourth hardening layer H4 is 10 μm.

In one embodiment of the present disclosure, the fourth hardening layer H4 is formed by a UV crosslinking curing method.

In one embodiment of the present disclosure, the fourth hardening layer H4 includes a nano-anti-fingerprint layer, to further achieve effects of smoothing a surface of the fourth hardening layer H4 and reducing fingerprint residue.

In one embodiment of the present disclosure, the fourth hardening layer H4 further includes a nano-scale antistatic hydrophobic coating layer.

In one embodiment of the present disclosure, a touch layer and a color filter layer are disposed between the third hardening layer H3 and the second hardening layer H2.

Figure 3:
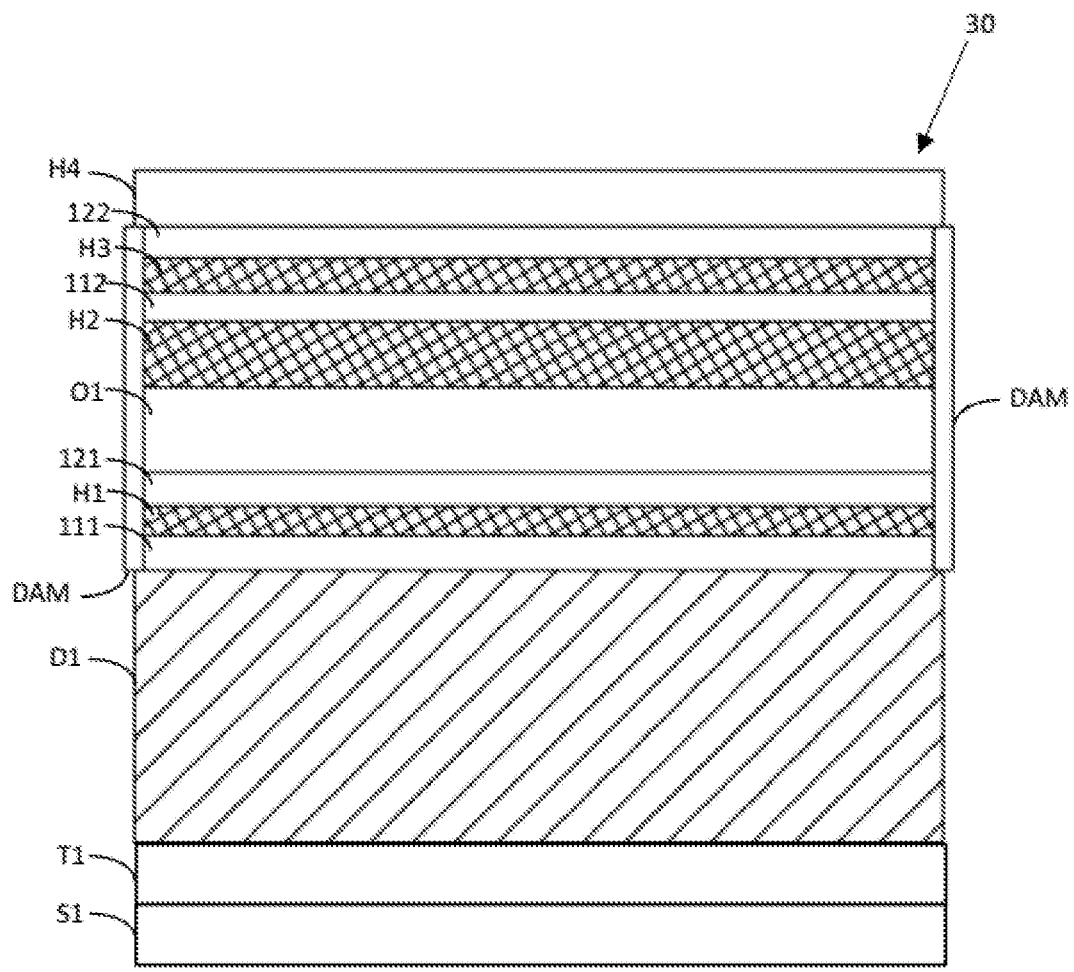
FIG. 3 shows a schematic structural diagram of a display panel according to one embodiment of the present disclosure.

Please refer to FIG. 3, FIG. 3 shows a schematic structural diagram of a display panel according to one embodiment of the present disclosure. The display panel 300 further includes a dam material layer DAM disposed on side edges of the first inorganic layer 111, the first hardening layer H1, the second inorganic layer 121, the organic planarization layer O1, the second hardening layer H2, the third inorganic layer 112, the third hardening layer H3, and the fourth inorganic layer 122, to further prevent water vapor and oxygen from overflowing.

Figure 4:
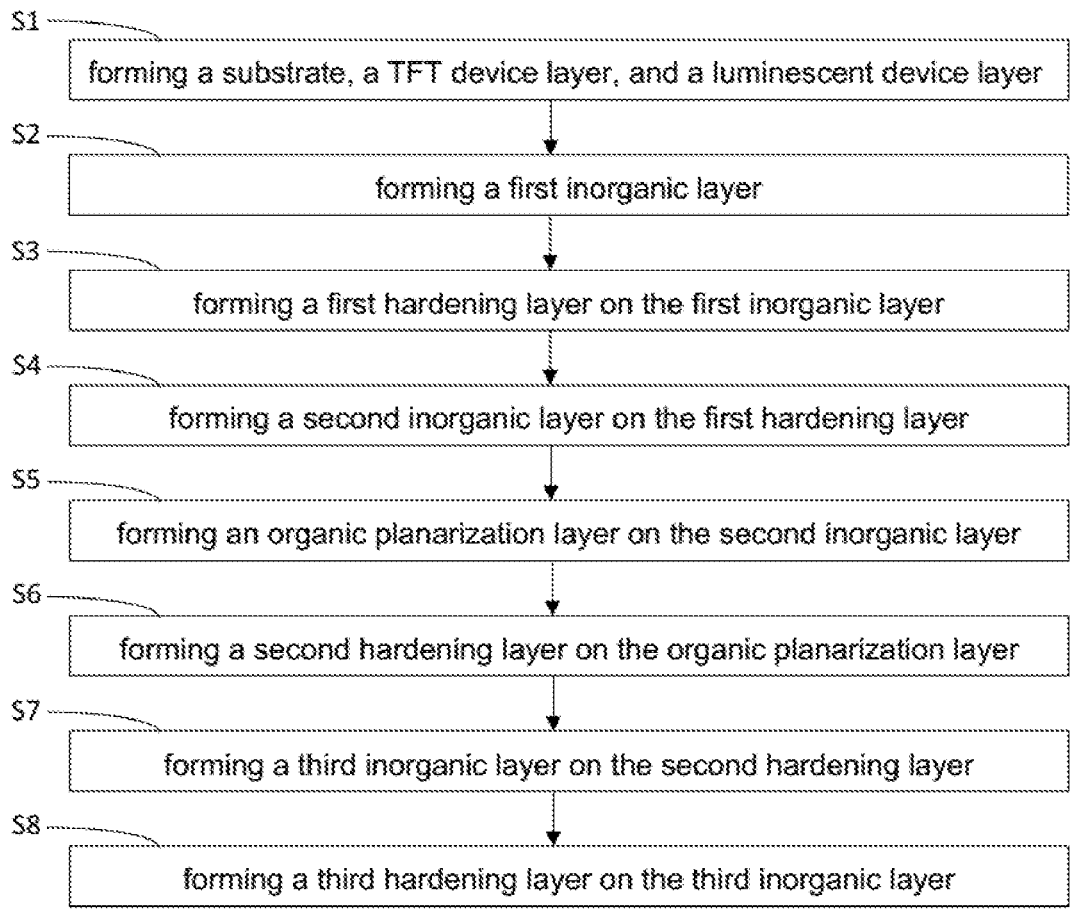
FIG. 4 shows a schematic flowchart of a method of manufacturing a display panel according to one embodiment of the disclosure.

Please refer to FIG. 4, FIG. 4 shows a schematic flowchart of a method of manufacturing a display panel according to one embodiment of the disclosure. As shown in the figure, the present disclosure also provides a method of manufacturing a display panel, including following steps:

S1: forming a substrate, a TFT device layer, and a luminescent device layer.

S2: forming a first inorganic layer.

S3: forming a first hardening layer on the first inorganic layer.

S4: forming a second inorganic layer on the first hardening layer.

S5: forming an organic planarization layer on the second inorganic layer.

S6: forming a second hardening layer on the organic planarization layer.

S7: forming a third inorganic layer on the second hardening layer.

S8: forming a third hardening layer on the third inorganic layer.

In one embodiment of the present disclosure, the method of manufacturing the display panel further includes forming a dam material layer DAM on side edges of the first inorganic layer 111, the first hardening layer H1, the second inorganic layer 121, the organic planarization layer O1, the second hardening layer H2, the third inorganic layer 112, and the third hardening layer H3, to achieve the effect of further preventing water vapor and oxygen from overflowing.

In one embodiment of the present disclosure, the method further comprises forming a fourth inorganic layer on the third hardening layer H3, and forming a fourth hardening layer on the fourth inorganic layer.

In one embodiment of the present disclosure, the dam material layer DAM is further formed on the side edges of the fourth inorganic layer and the fourth hardening layer.

In one embodiment of the present disclosure, the fourth hardening layer is formed by performing a coating method on the fourth inorganic layer and performing a UV crosslinking curing method.

In one embodiment of the present disclosure, after forming the fourth inorganic layer, performing a silicon-based organic evaluation on the display panel. When the silicon-based organic evaluation fails, forming the dam material layer DAM on the side edges of the first inorganic layer 111, the first hardening layer H1, the second inorganic layer 121, the organic planarization layer O1, the second hardening layer H2, the third inorganic layer 112, the third hardening layer H3, and the fourth inorganic layer 122; and when the silicon-based organic evaluation is successful, the dam body material layer DAM is not provided.

Figure 5:
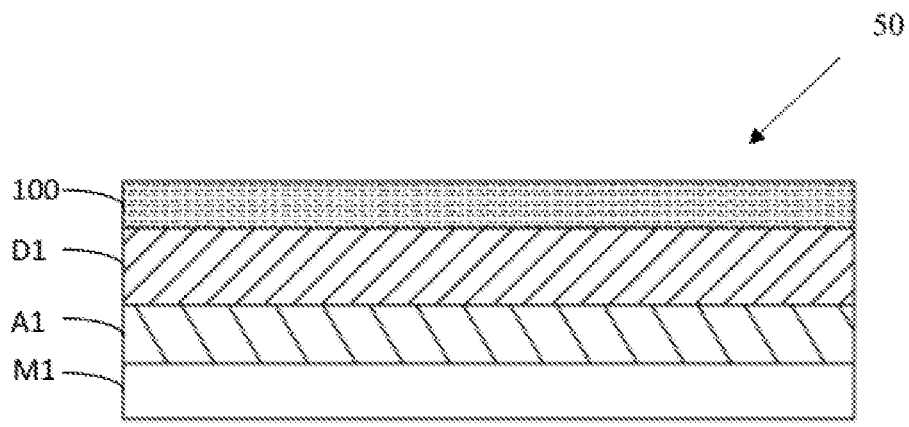
FIG. 5 shows a schematic structural diagram of a display panel according to one embodiment of the disclosure.

Please refer to FIG. 5, which shows a schematic structural diagram of a display panel according to one embodiment of the disclosure. As shown in the figure, the present disclosure further provides a display panel 50 including a metal layer M1, a connection layer A1 disposed on the metal layer M1, an organic light-emitting diode display device layer D1 disposed on the connection layer, and the thin film encapsulation layer 100 disposed on the organic light-emitting diode display device layer D1.

Further, the thin film encapsulation layer provided in the display panel 50 is not limited to the thin film encapsulation layer 100, but includes the thin film encapsulation layer of any of the embodiments described above.

By providing the metal layer M1, an effect of overall supportability of the display panel 50 is achieved, which helps the display panel 50 to restore planarity after being bent.

In one embodiment of the present disclosure, a thickness of the metal layer M1 is greater than three times a thickness of the fourth hardening layer H4.

In one embodiment of the present disclosure, a thickness of the metal layer M1 is 30 μm.

In one embodiment of the present disclosure, a constituent material of the metal layer M1 includes stainless steel (SUS).

In one embodiment of the present disclosure, the display panel 50 is an organic light emitting diode display panel.

A display panel and a manufacturing method thereof are provided by the present disclosure. The display panel includes a substrate, a thin film transistor (TFT) device layer, a luminescent device layer, and a thin film encapsulation layer, wherein the thin film encapsulation layer includes a first inorganic layer, a first hardening layer disposed on the first inorganic layer, a second inorganic layer disposed on the first hardening layer, an organic planarization layer disposed on the second inorganic layer, a second inorganic layer disposed on the first hardening layer, an organic planarization layer disposed on the second inorganic layer, a second hardening layer disposed on the organic planarization layer, a third inorganic layer disposed on the second hardening layer, and a third hardening layer disposed on the third inorganic layer, thereby realizing a cover window and encapsulation structure characteristics at the same time, and achieving ultra-thin encapsulation.

The above description only the preferred embodiments of the present disclosure. It should be noted that for those of ordinary skill in the art without departing from the principles of the present disclosure, several improvements and adjustments can be made, and these improvements and adjustments should also be considered in the protection scope of the present disclosure.

What is claimed is:

1. A display panel, comprising:
    a substrate, a thin film transistor (TFT) device layer, a luminescent device layer, and a thin film encapsulation layer, wherein the thin film encapsulation layer comprises:
    a first inorganic layer;
    a first hardening layer disposed on the first inorganic layer;
    a second inorganic layer disposed on the first hardening layer;
    an organic planarization layer disposed on the second inorganic layer;
    a second hardening layer disposed on the organic planarization layer;
    a third inorganic layer disposed on the second hardening layer;
    a third hardening layer disposed on the third inorganic layer;

a fourth inorganic layer disposed on the third hardening layer; and a fourth hardening layer disposed on the fourth inorganic layer;

wherein the fourth hardening layer comprises a nano-anti-fingerprint layer.

2. The display panel as claimed in claim 1, further comprising a dam material layer disposed on side edges of the first inorganic layer, the first hardening layer, the second inorganic layer, the organic planarization layer, the second hardening layer, the third inorganic layer, and the third hardening layer.

3. The display panel as claimed in claim 1, wherein a thickness of the second hardening layer is greater than a thickness of the first hardening layer and a thickness of the third hardening layer.

4. The display panel as claimed in claim 1, wherein a material of the first inorganic layer comprises silicon nitride.

5. The display panel as claimed in claim 1, wherein a material of the second inorganic layer comprises silicon oxide.

6. The display panel as claimed in claim 1, wherein a material of the third inorganic layer comprises silicon nitride.

7. The display panel as claimed in claim 1, further comprising a touch layer and a color filter layer disposed between the third hardening layer and the second hardening layer.

8. The display panel as claimed in claim 1, wherein the thin film encapsulation layer is disposed on a cathode of the luminescent device layer.

9. A method of manufacturing a display panel, comprising following steps:
forming a substrate, a TFT device layer, and a luminescent device layer;
forming a thin film encapsulation layer, wherein steps of forming the thin film encapsulation layer comprises:
forming a first inorganic layer;
forming a first hardening layer on the first inorganic layer;
forming a second inorganic layer on the first hardening layer;
forming an organic planarization layer on the second inorganic layer;
forming a second hardening layer on the organic planarization layer;
forming a third inorganic layer on the second hardening layer;
forming a third hardening layer on the third inorganic layer;
forming a fourth inorganic layer on the third hardening layer; and
forming a fourth hardening layer on the fourth inorganic layer;

wherein the fourth hardening layer comprises a nano-anti-fingerprint layer.

10. The method of manufacturing the display panel as claimed in claim 9, further comprising forming a dam material layer on side edges of the first inorganic layer, the first hardening layer, the second inorganic layer, the organic planarization layer, the second hardening layer, the third inorganic layer, and the third hardening layer.

11. The method of manufacturing the display panel as claimed in claim 9, wherein the dam material layer is further formed on side edges of the fourth inorganic layer and the fourth hardening layer.

12. The method of manufacturing the display panel as claimed in claim 9, wherein a fourth hardening layer is formed by performing a coating method and a UV cross-linking curing method on the fourth inorganic layer.

13. A display panel, comprising:
a metal layer;
a connection layer disposed on the metal layer;
an organic light-emitting diode display device layer disposed on the connection layer; and
a thin film encapsulation layer disposed on the organic light-emitting diode display device layer;
wherein the thin film encapsulation layer comprises:
a first inorganic layer;
a first hardening layer disposed on the first inorganic layer;
a second inorganic layer disposed on the first hardening layer;
an organic planarization layer disposed on the second inorganic layer;
a second hardening layer disposed on the organic planarization layer;
a third inorganic layer disposed on the second hardening layer;
a third hardening layer disposed on the third inorganic layer;
a fourth inorganic layer disposed on the third hardening layer; and
a fourth hardening layer disposed on the fourth inorganic layer;
wherein the fourth hardening layer comprises a nano-anti-fingerprint layer.

14. The display panel as claimed in claim 13, wherein the display panel further comprises a dam material layer disposed on side edges of the first inorganic layer, the first hardening layer, the second inorganic layer, the organic planarization layer, the second hardening layer, the third inorganic layer, and the third hardening layer.

15. The display panel as claimed in claim 13, wherein a thickness of the metal layer is greater than three times a thickness of the fourth hardening layer.

* * * * *